(12) United States Patent
Ju et al.

(10) Patent No.: US 8,362,608 B2
(45) Date of Patent: Jan. 29, 2013

(54) ULTRA WIDEBAND HERMETICALLY SEALED SURFACE MOUNT TECHNOLOGY FOR MICROWAVE MONOLITHIC INTEGRATED CIRCUIT PACKAGE

(75) Inventors: In Kwon Ju, Daejeon (KR); In Bok Yom, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 490 days.

(21) Appl. No.: 12/681,617

(22) PCT Filed: Jun. 16, 2008

(86) PCT No.: PCT/KR2008/003380
§ 371 (c)(1),
(2), (4) Date: Apr. 2, 2010

(87) PCT Pub. No.: WO2009/044987
PCT Pub. Date: Apr. 9, 2009

(65) Prior Publication Data
US 2010/0213584 A1    Aug. 26, 2010

(30) Foreign Application Priority Data
Oct. 5, 2007  (KR) .......................... 10-2007-0100305

(51) Int. Cl.
*H01L 23/34* (2006.01)
(52) U.S. Cl. ................. 257/728; 257/660; 257/E23.114
(58) Field of Classification Search .................. 257/660, 257/728
See application file for complete search history.

(56) References Cited

U.S. PATENT DOCUMENTS

| 5,214,498 | A | 5/1993 | Lehman et al. |
| 5,982,250 | A * | 11/1999 | Hung et al. ...................... 333/26 |
| 6,118,357 | A | 9/2000 | Tomasevic et al. |
| 6,124,636 | A | 9/2000 | Kusamitsu |
| 6,172,412 | B1 | 1/2001 | Wein et al. |
| 6,215,377 | B1 | 4/2001 | Douriet |
| 7,911,292 | B2 * | 3/2011 | Byun et al. ...................... 333/26 |
| 8,049,319 | B2 * | 11/2011 | Ju et al. ........................ 257/685 |

FOREIGN PATENT DOCUMENTS

| JP | 6-268532 A | 9/1994 |
| JP | 8-250913 A | 9/1996 |
| JP | 2004-071772 A | 3/2004 |
| JP | 2005-311338 A | 11/2005 |
| KR | 2005-0112465 A | 11/2005 |

* cited by examiner

*Primary Examiner* — Daniel Whalen
(74) *Attorney, Agent, or Firm* — Rabin & Berdo, P.C.

(57) ABSTRACT

An ultra wideband hermetically sealed surface mount package for a microwave monolithic integrated circuit (MMIC) is provided including: an integrated circuit; a package body being mounted with the integrated circuit and comprising a plurality of first dielectrics formed in a multilayer, a first line unit mounted to a circuit substrate and is electrically connected with an external circuit, a second line unit upwardly extended from the first line unit and is electrically connected with the first line unit, a third line unit extended to the right angle from the second line unit and is electrically connected with the second line unit, and a bonding unit that electrically connects the third line unit and the mounted integrated circuit; and a package cover being formed on the package body to seal the integrated circuit and comprising a plurality of second dielectrics formed in a multilayer.

7 Claims, 10 Drawing Sheets

ULTRA WIDEBAND HERMETICALLY SEALED SURFACE MOUNT TECHNOLOGY FOR MICROWAVE MONOLITHIC INTEGRATED CIRCUIT PACKAGE

TECHNICAL FIELD

The present invention relates to an ultra wideband hermetically sealed surface mount package for a microwave monolithic integrated circuit (MMIC) that operates in the region of microwaves and millimeter waves corresponding to a high frequency region.

This work was supported by the Satellite Communications System for Communications, Ocean, and Meteorological Satellite of MIC/IITA. [2007-S-301, Development of Satellite Communications System for Communications, Ocean, and Meteorological Satellite]

BACKGROUND ART

A microwave monolithic integrated circuit (MMIC) is used in a transmitter and a receiver of various types of radio systems such as portable communication systems, military communication systems, satellite communication systems, and the like. The MMIC is manufactured through a semiconductor manufacturing process and is formed in an unpacked bare chip. Therefore, the MMIC needs an appropriate package.

A highly efficient package for MMIC of microwaves and millimeter waves must satisfy mechanical, electrical, and environmental requirements. In an aspect of mechanical and environmental requirements, the package must provide a function of protecting an internal circuit from surrounding environments. In an aspect of electrical requirements, the package must provide a minimum insertion loss and a high isolation between terminals and also provide a function of shielding electromagnetic waves in order to reduce electromagnetic interference (EMI). Also, another important electrical requirement is to not allow the package to give an adverse effect on a circuit performance or to make parasitic cavity resonance deteriorate the circuit performance.

Generally, an internal circuit mounted onto a surface mount package may be electrically connected with an external circuit by vertical interconnection and also may need a low-loss vertical interconnection in order to completely transfer signals of a microwave band and a millimeter wave band.

DISCLOSURE OF INVENTION

Technical Problem

An aspect of the present invention provides an ultra wideband hermetically sealed surface mount package for a microwave monolithic integrated circuit (MMIC) that can reduce an insertion loss and obtain excellent impedance matching using a trough line and a slab line, and thereby can reduce the discontinuity of vertical transition.

Another aspect of the present invention also provides an ultra wideband hermetically sealed surface mount package for an MMIC that can reduce a radiation loss and crosstalk using a shielded multilayer coplanar waveguide (SMCPW) line.

Another aspect of the present invention also provides an ultra wideband hermetically sealed surface mount package for an MMIC that can form a cavity for mounting an integrated circuit using a plurality of ground planes and ground vias and thereby can shield against electromagnetic interference (EMI).

Another aspect of the present invention also provides an ultra wideband hermetically sealed surface mount package for an MMIC that can provide a sealing function using a package cover and thereby can protect an internal circuit from an external environment.

The present invention is not limited to the above purposes and other purposes not described herein will be apparent to those of skill in the art from the following description.

Technical Solution

According to an aspect of the present invention, there is provided an ultra wideband hermetically sealed surface mount package for a microwave monolithic integrated circuit (MMIC), the package including: an integrated circuit; a package body being mounted with the integrated circuit and including a plurality of first dielectrics that is formed in a multilayer, a first line unit that is mounted on a circuit substrate and is electrically connected with an external circuit, a second line unit that is upwardly extended from the first line unit and is electrically connected with the first line unit, a third line unit that is extended to the right angle from the second line unit and is electrically connected with the second line unit, and a bonding unit that electrically connects the third line unit and the mounted integrated circuit; and a package cover being formed on the package body to seal the integrated circuit and including a plurality of second dielectrics that is formed in a multilayer.

In an aspect of the present invention, the first line unit may include a shielded multilayer coplanar waveguide (SMCPW)1 line that is horizontally formed and is electrically connected with the circuit substrate.

Also, the second line unit may include a trough line that is vertically extended from the SMCPW1 line and is electrically connected with the SMCPW1 line, and a slab line that is vertically extended from the trough line and is electrically connected with the trough line.

Also, the third line unit may include an SMCPW2 line that is horizontally extended from the slab line and is electrically connected with the slab line, an SMCPW3 line that is horizontally extended from the SMCPW2 line and is electrically connected with the SMCPW2, and a grounded coplanar waveguide (GCPW)1 line that is horizontally extended from the SMCPW3 line and is electrically connected with the SMCPW3.

Also, the second line unit may include a signal via that transfers an electrical signal from the external circuit, a plurality of ground planes, and a plurality of ground vias.

Also, the circuit substrate may include a GCPW2 line that is electrically connected with the first line unit.

Also, an SMCPW1 line of the first line unit, and an SMCPW2 line and an SMCPW3 line of the third line unit may be formed in a shielding structure surrounded by a plurality of ground planes and a plurality of ground vias.

Also, the package body may include a thermal via that dissipates heat generated from the integrated circuit.

Also, the bonding unit may electrically connect a GCPW1 line of the third line unit and a radio frequency (RF) pad of the integrated circuit through wire bonding or ribbon bonding, electrically connect a ground plane of the package body and a ground pad of the integrated circuit through wire bonding or ribbon bonding, or electrically connect an internal direct current (DC) pad of the package body and an internal DC pad of the integrated circuit through wire bonding or ribbon bonding.

Additional aspects, features, and/or advantages of the invention will be set forth in part in the description that follows and, in part, will be apparent from the description, or may be learned by practice of the invention.

Also, the thickness of a layer, a film, or a region in the drawings is exaggerated to clearly describe the invention. When it is described that a layer or a film is formed "on" another layer or another film, the layer or the film may be directly formed on the other layer or film. Also, still another layer or film may be provided therebetween.

MODE FOR THE INVENTION

Reference will now be made in detail to embodiments of the present invention, examples of which are illustrated in the accompanying drawings, wherein like reference numerals refer to the like elements throughout. The embodiments are described below in order to explain the present invention by referring to the figures.

Figure 1:
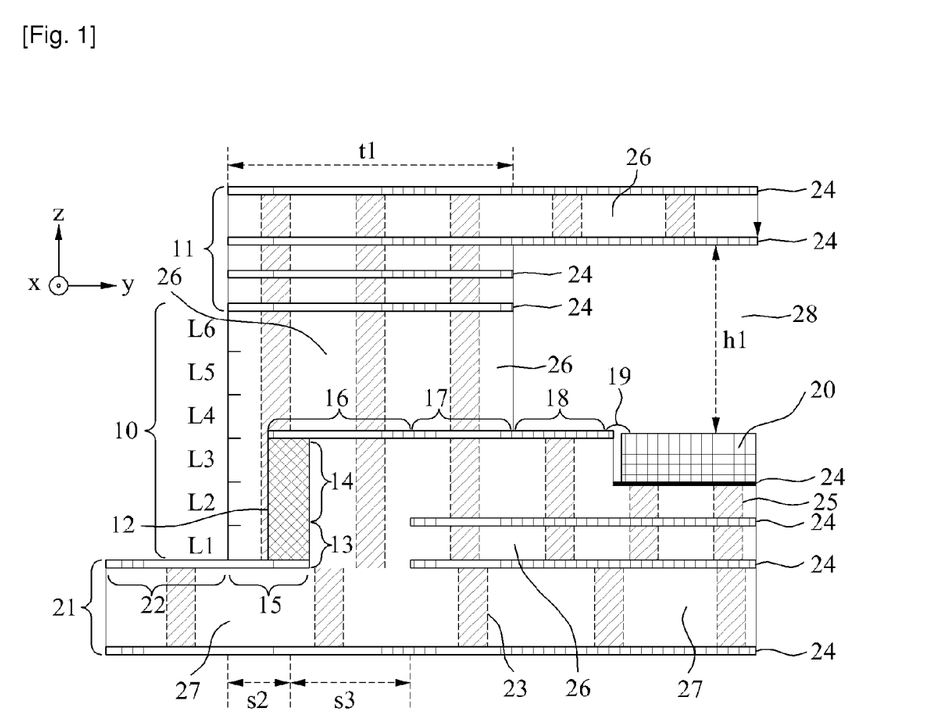
FIG. 1 is a cross-sectional view illustrating an example of an ultra wideband hermetically sealed surface mount package for a microwave monolithic integrated circuit (MMIC) being mounted onto a circuit substrate according to an exemplary embodiment of the present invention.
Figure 2:
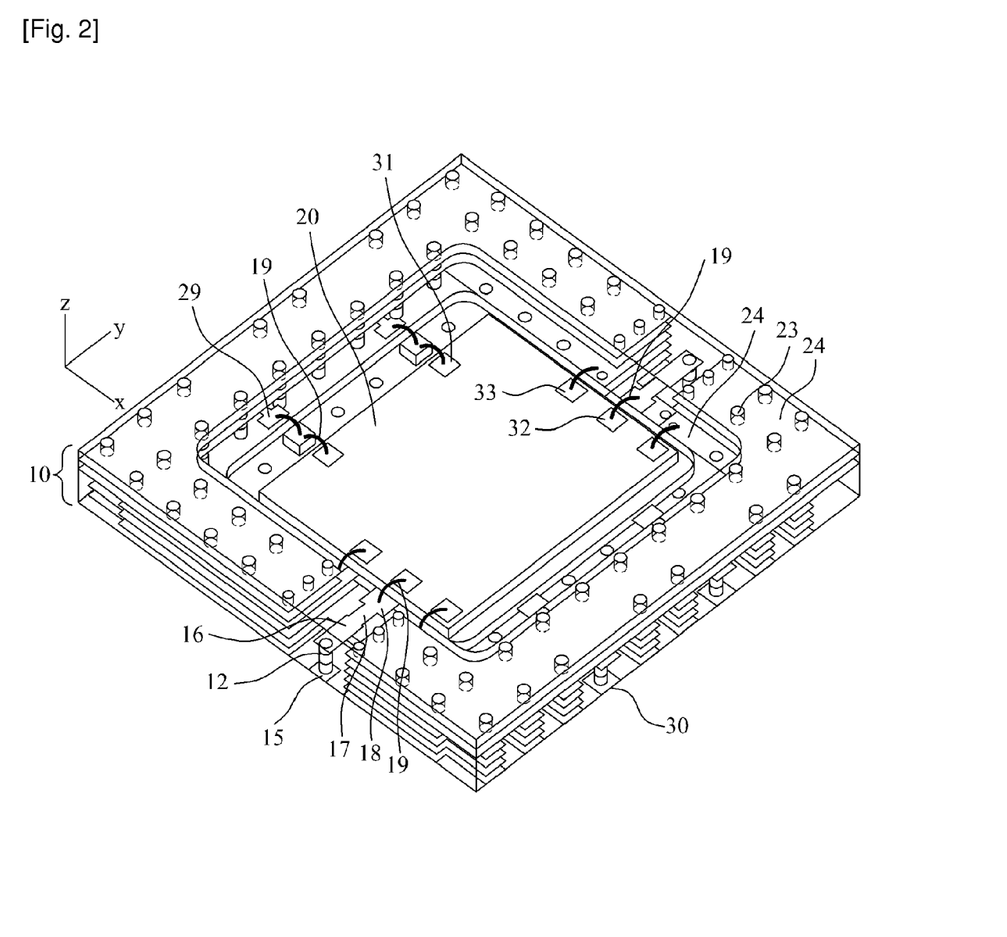
FIG. 2 is a perspective view illustrating an example of a package body shown in FIG. 1.

FIG. 1 is a cross-sectional view illustrating an example of an ultra wideband hermetically sealed surface mount package for a microwave monolithic integrated circuit (MMIC) being mounted onto a circuit substrate 21 according to an exemplary embodiment of the present invention, and FIG. 2 is a perspective view illustrating an example of a package body 10 shown in FIG. 1.

Referring to FIGS. 1 and 2, the ultra wideband hermetically sealed surface mount package for the MMIC may include the package body 10 and a package cover 11.

The package body 10 may be mounted onto the circuit substrate 21 and be electrically connected with an external circuit (not shown). The circuit substrate 21 may include a grounded coplanar waveguide (GCPW)2 line. The GCPW2 line 22 may be electrically connected with a first line unit. The GCPW2 line 22 may have a shielding structure surrounded by a plurality of ground vias 23 and a plurality of ground planes 24.

An integrated circuit 20 may be mounted to the package body 10. The integrated circuit 20 may include the MMIC. The MMIC is a kind of monolithic integrated circuit (MIC) and denotes an integrated circuit that forms a connection portion of a circuitry operating in a microwave frequency band of about 809 MHz through about 30 GHz on a semiconductor substrate with a high speed and an excellent conductivity such as gallium-arsenic (GaAs) and the like.

The package body 10 may include a plurality of first dielectrics L1 through L6, the first line unit, a second line unit, a third line unit, and a bonding unit 19.

The plurality of first dielectrics L1 through L6 may be formed in a multilayer. For example, the plurality of first dielectrics L1 through L6 may be formed in a six-layered dielectric.

The first line unit may be mounted to the circuit substrate 21 and be electrically connected with the external circuit. The first line unit may include a shielded multilayer coplanar waveguide (SMCPW)1 line 15. The SMCPW1 line 15 may be electrically connected with the GCPW2 line 22 of the circuit substrate 21 and receive electrical signals from the external circuit using the GCPW2 line 22.

The second line unit may include a trough line 13 and a slab line 14. The trough line 13 may be vertically extended from the SMCPW1 line 15 and be electrically connected with the circuit substrate 21. The slab circuit 14 may be electrically connected with the trough line 13 in the same direction.

Also, the second line unit may include a signal via 12 transferring electrical signals from the external circuit, the plurality of ground vias 23, and the plurality of ground planes. Specifically, the second line unit may receive the electrical signals from the external circuit through the signal via 12, and transfer the electrical signals to the third line unit. Also, the second line unit may ground the electrical signals using the plurality of ground vias 23 and the plurality of ground planes 24.

The third line unit may be electrically connected with the second line unit. The third line unit may include an SMCPW2 line 16, an SMCPW3 line 17, and a GCPW1 line 18. The SMCPW2 line 16 may be vertically extended from the slab line 14 and be electrically connected with the slab line 14. The SMCPW3 line 17 may be horizontally extended from the SMCPW2 line 16 and be electrically connected with the SMCPW2 line 16. The GCPW1 line 18 may be horizontally extended from the SMCPW3 line 17 and be electrically connected with the SMCPW3 line 17.

The SMCPW2 line 16 and the SMCPW3 line 17 may be formed in a shielding structure surrounded by the plurality of ground vias 23 and the plurality of ground planes 24.

The bonding unit 19 may electrically connect the third line unit and the integrated circuit 20. Specifically, the bonding unit 19 may electrically connect the GCPW1 line 18 of the third line unit and a radio frequency (RF) pad 32 of the integrated circuit 20 through wire bonding or ribbon bonding.

Also, the bonding unit 19 may electrically connect the ground plane 24 of the package body 10 and a ground pad 33 of the integrated circuit 20 through wire bonding or ribbon bonding. Also, the bonding unit 19 may electrically connect an internal direct current (DC) pad 29 of the package body 10 and an internal DC pad 31 of the integrated circuit 20 through wire bonding or ribbon bonding.

The package cover 11 may include a plurality of second dielectrics that is formed in a multilayer. For example, the package cover 11 may be formed in a six-layered dielectric. Also, the package cover 11 may be formed on the package body 10 to seal the integrated circuit 20. Therefore, the package cover 11 may protect the internal circuit from the external environmental elements such as humidity, dust, and the like.

Also, a reference numeral 27 denotes dielectric of the circuit substrate 21 and a reference numeral 26 denotes dielectric of the package body 10 and the package cover 11.

Hereinafter, an ultra wideband hermetically sealed surface mount package for an MMIC according to the present invention will be further described in detail.

The GCPW2 line 22 of the external circuit substrate 21 may be electrically connected with the SMCPW1 line 15 of the first line unit. The SMCPW1 line 15 may be electrically connected with the trough line 13 of the second line unit. The trough line 13 may be electrically connected with the slab line 14 and the slab line 14 may be electrically connected with the SMCPW2 line 16 of the third line unit. Also, the SMCPW2 line 16 may be electrically connected with the SMCPW3 line 17, and the SMCPW3 line 17 may be electrically connected with the GCPW1 line 18. The GCPW1 line 18 may be electrically connected with the integrated circuit 20 through wire bonding or ribbon bonding of the bonding unit 19.

Therefore, microwave signals from the external circuit may be transferred to the RF pad 32 of the integrated circuit 20 through the electrically connected GCPW2 line 22, the SMCPW1 line 15, the trough line 13, the slab line 14, the SMCPW2 line 16, the SMCPW3 line 17, the GCPW1 line 18, and the bonding unit 19. At the same time, the microwave signals may be transferred to the ground pads 33 that are formed on both sides of the RF pad 32.

The ground pad 33 may be connected with the ground plane 24 of the package body 10 through wire bonding or ribbon bonding of the bonding unit 19. Therefore, it is possible to reduce the discontinuity in bonding.

Control signals or power applied from the external DC pad 30 may be transferred to the internal DC pad 31 of the integrated circuit 20 through wire bonding or ribbon bonding of the bonding unit 19.

A thermal via 25 may be provided in a lower portion of the package body 10 including the integrated circuit 20 to thereby efficiently dissipate the heat generated from the integrated circuit 20.

Figure 3:
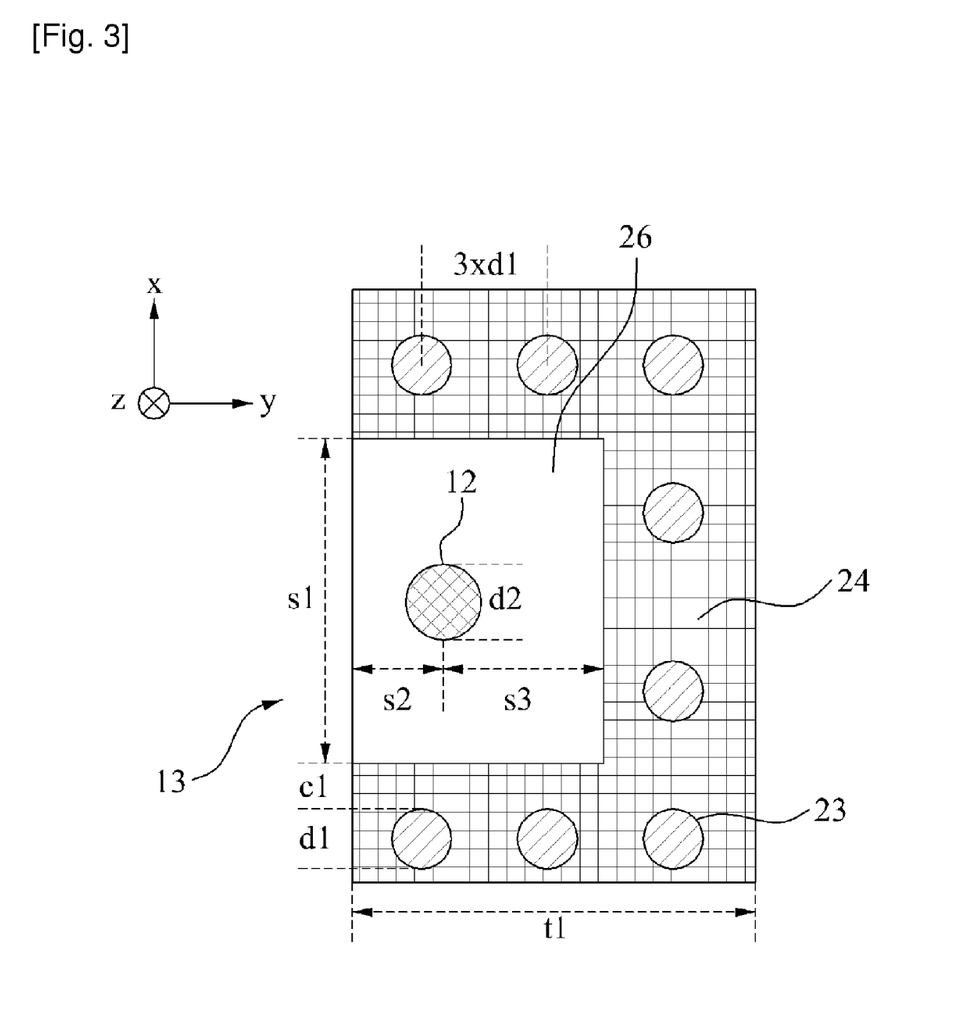
FIG. 3 is a cross-sectional view illustrating a connection structure of a trough line shown in FIG. 1.
Figure 4:
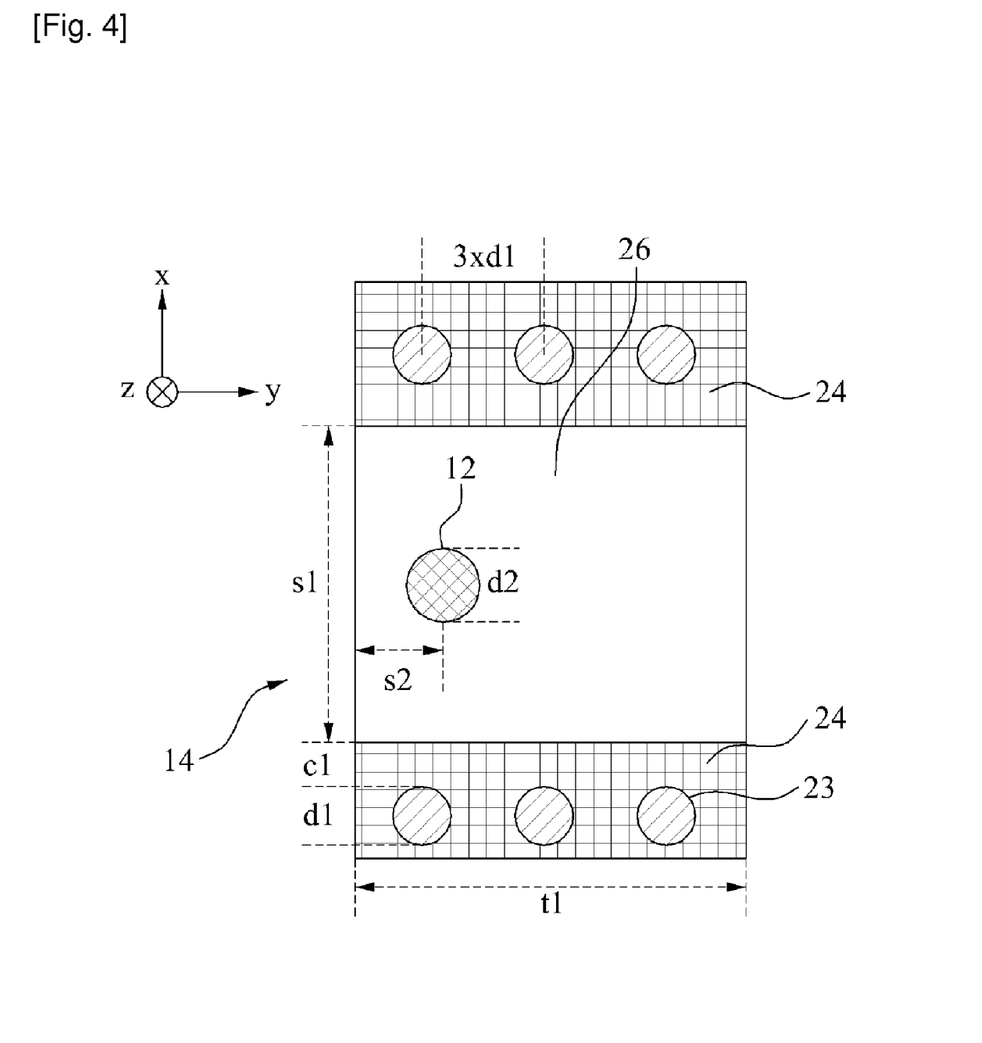
FIG. 4 is a cross-sectional view illustrating a connection structure of a slab line shown in FIG. 1.

According to an aspect of the present invention, there is provided a new vertical transition by applying the trough line 13 of FIG. 3 and the slab line 14 of FIG. 4 to the package body 10. The new vertical transition adopting the trough line 13 and the slab line 14 may reduce the discontinuity of a vertical transition that uses a conventional via hole. Therefore, a low loss package is enabled.

FIG. 3 is a cross-sectional view illustrating a connection structure of the trough line 13 shown in FIG. 1, and FIG. 4 is a cross-sectional view illustrating a connection structure of the slab line 14 shown in FIG. 1.

As shown in FIGS. 3 and 4, each of the trough line 13 and the slab line 14 may consist of the signal via 12 and a ground. The ground may consist of the ground vias 23 and the ground planes 24. Also, referring to FIG. 1, the trough line 13 may correspond to layer L1 and the slab line 14 may correspond to layers L2 and L3. The characteristic impedance of the trough line 13 and characteristic impedance of the slab line 14 may be represented as $$Z_0 = \frac{138}{\sqrt{\varepsilon_r}} \log\left(1.17 \times \frac{s1}{d2}\right)(\Omega),$$ [Equation 1]

and $$Z_0 = \frac{138}{\sqrt{\varepsilon_r}} \log\left(\frac{4 \times s1}{\pi \times d2}\right)(\Omega).$$ [Equation 2]

where d1 denotes the diameter of the ground via 23 and s1 denotes the interval distance between the ground planes 24.

In FIGS. 3 and 4, d1 denotes the diameter of the ground via 23, d2 denotes the diameter of the signal via 12, and C1 denotes the interval distance between the ground via 23 and the ground plane 24. A pitch between the ground vias 23 is 3*d1 that is three times of D1. Also, s1 denotes the interval distance between the ground planes 24 and is twice of s3. t1 denotes the thickness of the package.

Figure 5:
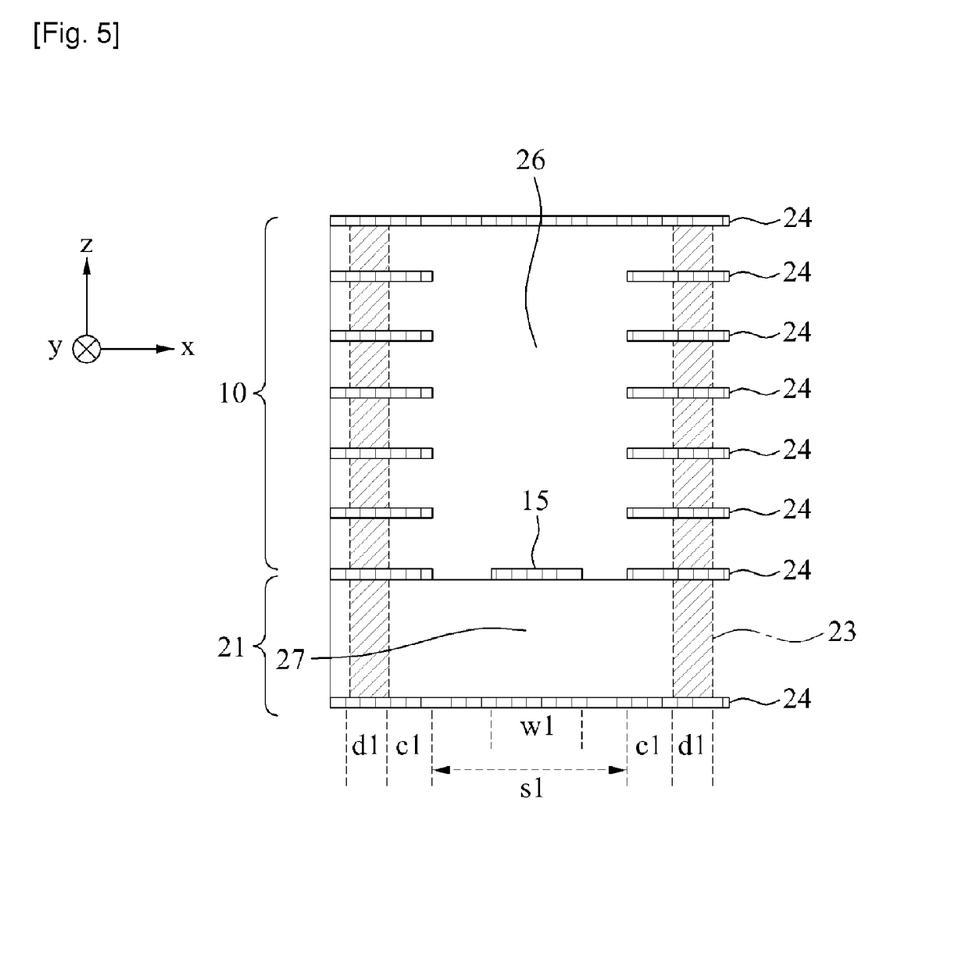
FIGS. 5 through 7 are cross-sectional views illustrating a shielded multilayer coplanar waveguide (SMCPW)1 line, a SMCPW2 line, and a SMCPW3 line shown in FIG. 1.
Figure 6:
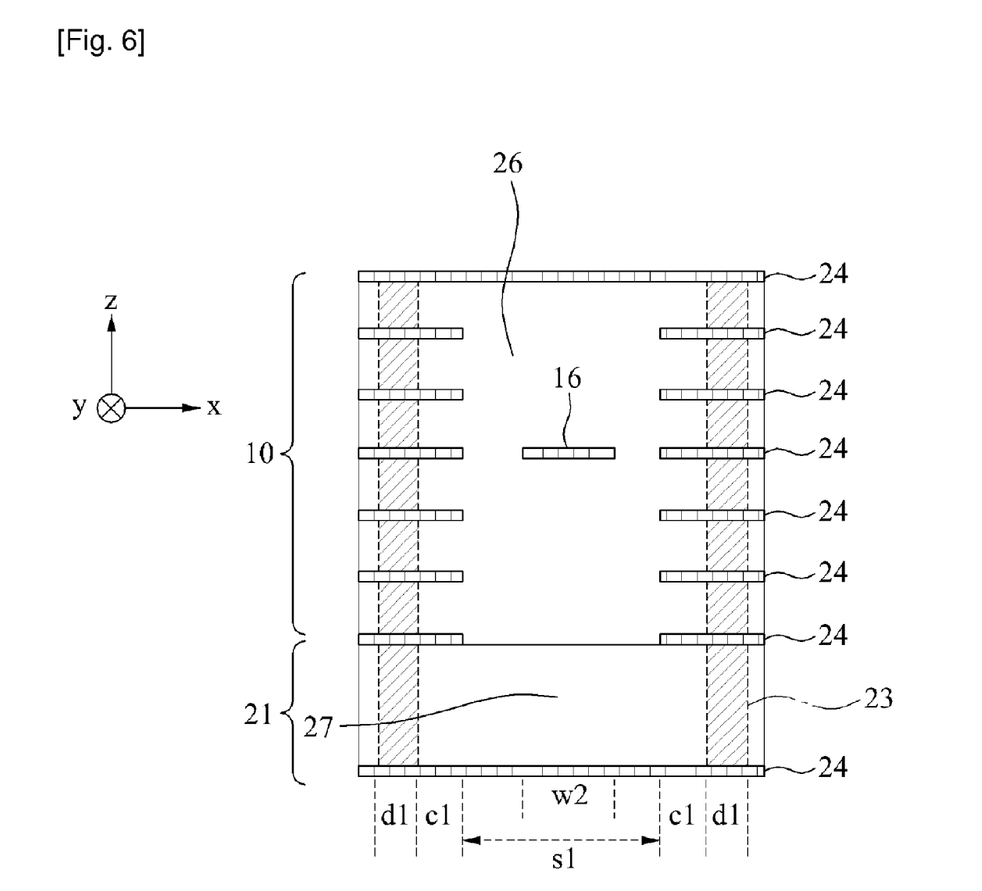
Figure 7:
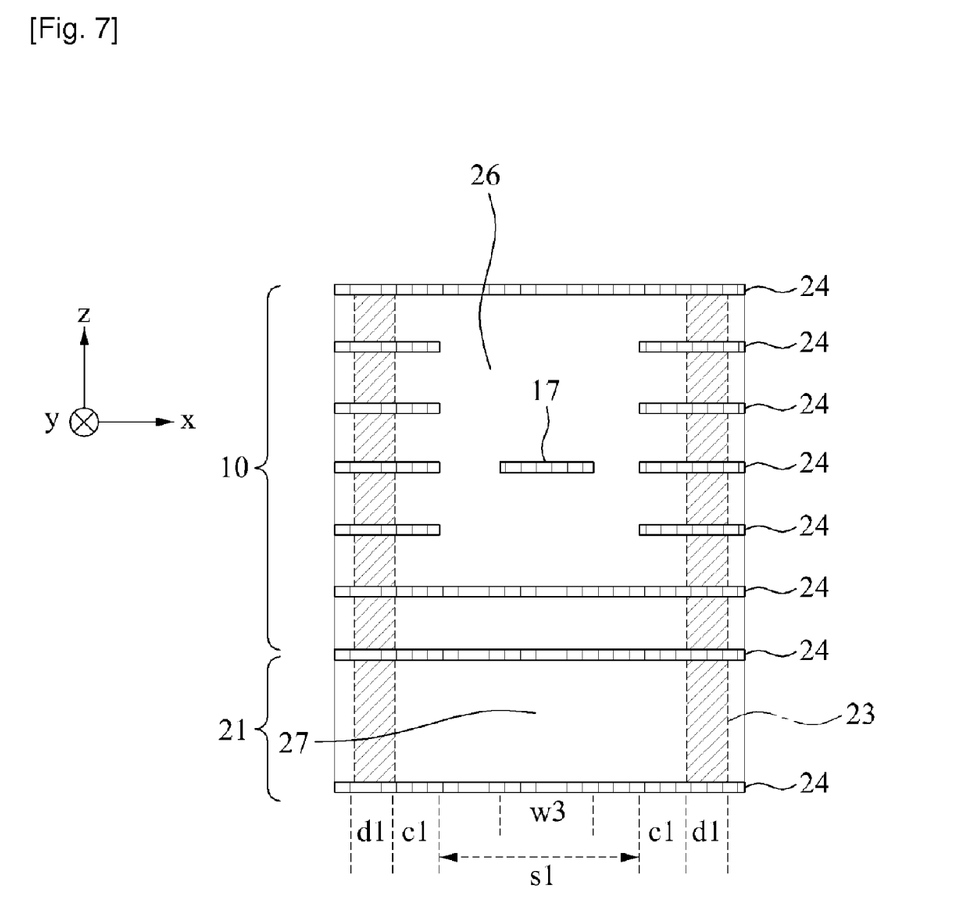

FIGS. 5 through 7 are cross-sectional views illustrating the SMCPW1 line 15, the SMCPW2 line 16, and the SMCPW3 line 17 shown in FIG. 1.

As shown in FIGS. 5 through 7, according to an aspect of the present invention, the new vertical transition may be provided using SMCPW lines in order to reduce a radiation loss and crosstalk.

The SMCPW1 line 15 of FIG. 5 may be formed by electrically connecting the package body 10 and the circuit substrate 21. The SMCPW1 line 15 may have the shielding structure surrounded by the plurality of ground vias 23 and the plurality of ground planes 24. Also, the SMCPW2 line 16 of FIG. 6 and the SMCPW3 line 17 of FIG. 7 may have the shielding structure surrounded by the ground vias 23 and the ground planes 24.

Through the shielding structure, the package body 10 may prevent internal signals from being externally radiated and thereby reduce the radiation loss. Also, the package body 10 may prevent external signals from internally invading and thereby reduce the crosstalk.

The characteristic of the multilayer structure such as SMCPW used in the present exemplary embodiment may be analyzed using an electromagnetic analysis scheme. Specifically, w1, w2, and w3 may be obtained from the result of the electromagnetic analysis. In this instance, w1, w2, and w3 denote the width of the SMCPW1 line 15, the width of SMPCW2 line 16, and the width of SMPCW3 line 17 having 50 ohms of characteristic impedance, respectively.

Figure 8:
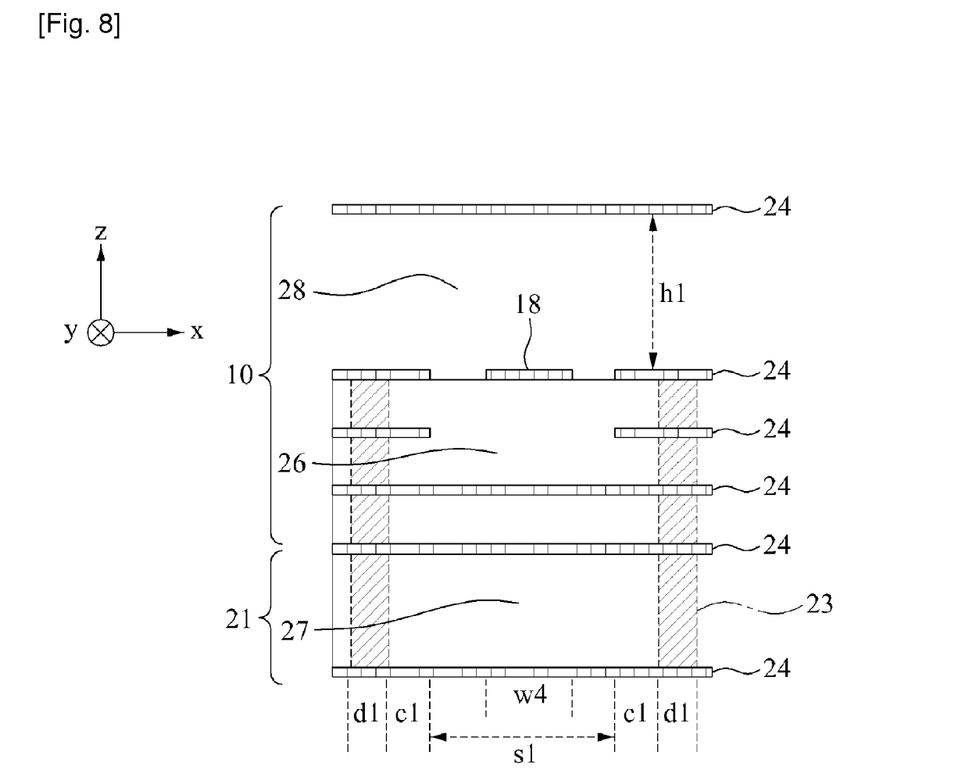
FIG. 8 is a cross-sectional view illustrating a connection structure of a grounded coplanar waveguide (GCPW)1 line shown in FIG. 1.

FIG. 8 is a cross-sectional view illustrating a connection structure of the GCPW1 line 18 shown in FIG. 1.

As shown in FIG. 8, h1 denotes the height from the integrated circuit 20 to the package cover 11. By reducing height h1, a small package may be manufactured. Specifically, the package size may vary depending on height h1 from the integrated circuit 20 to the package cover 11. However, when reducing height h1, the internal crosstalk of the package may be increased and the gain and isolation of the integrated circuit 20 may be deteriorated. Therefore, height h1 needs to be appropriately set in order to prevent thermal deterioration of the performance of the integrated circuit 20. In the present exemplary embodiment, the minimum height without deteriorating the performance of the integrated circuit 20 may be set to about 600 μm.

Figure 9:
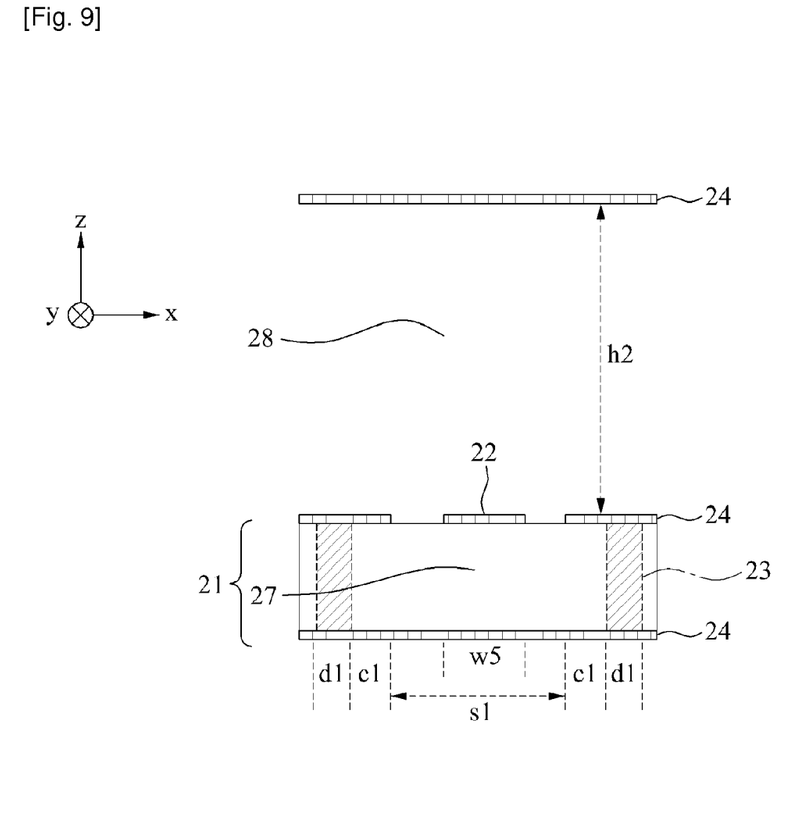
FIG. 9 is a cross-sectional view illustrating a connection structure of a GCPW2 line shown in FIG. 1.

FIG. 9 is a cross-sectional view illustrating a connection structure of the GCPW2 line 22 shown in FIG. 1.

As shown in FIG. 9, the GCPW2 line 22 may be formed in a general GCPW structure and may function as a transmission line of the circuit substrate 21.

Also, resonance may occur in a cavity 28 for mounting of the integrated circuit 20. TE101 mode frequency $f_c$ that is a minimum resonant frequency of the empty cavity 28 and cavity resonant frequency $f_r$ embedded with a microstrip may be respectively computed by $$f_c = \frac{1}{2\sqrt{\varepsilon_0 \mu_0}} \sqrt{\left(\frac{1}{W}\right)^2 + \left(\frac{1}{L}\right)^2}, \quad \text{[Equation 3]}$$

and $$f_r = f_c \sqrt{1 - \left(\frac{d}{H}\right) \times \left(\frac{\varepsilon_r - 1}{\varepsilon_r}\right)}. \quad \text{[Equation 4]}$$

Here, it is assumed that L denotes the length of the cavity 28, W denotes the width of the cavity 28, H denotes the height of the cavity 28, $\varepsilon_r$ denotes the relative dielectric constant of the dielectric 26, and d denotes the thickness of a microstrip substrate d=0.2 mm, and L=3.6 mm, W=3.6 mm, H=0.8 mm, and $\varepsilon_r$=5.8. In this case, $f_c$ and $f_r$ may have values of 55.884 GHz and 52.444 GHz, respectively.

Therefore, according to an aspect of the present invention, an ultra wideband hermetically sealed surface mount package for an MMIC may not give an adverse effect on a circuit performance within the frequent range of less than about 52 GHz. Also, the circuit performance may not be deteriorated by the parasitic cavity resonance.

Figure 10:
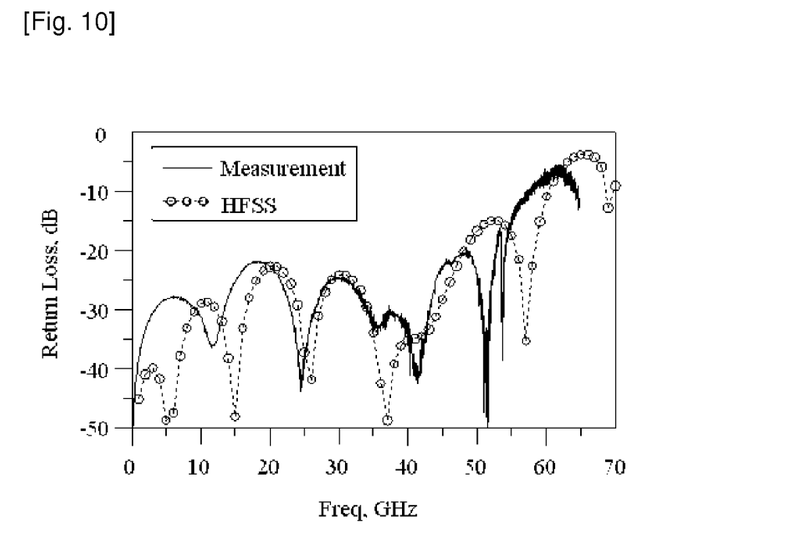
FIG. 10 is a graph illustrating a return loss characteristic by a simulation and a measurement with respect to an ultra wideband hermetically sealed mount package for an MMIC according to an exemplary embodiment of the present invention.

FIG. 10 is a graph illustrating a return loss characteristic by a simulation and a measurement with respect to an ultra wideband hermetically sealed mount package for an MMIC according to an exemplary embodiment of the present invention. The simulation was performed by a High Frequency Structure Simulator (HFSS) that is an electromagnetic analysis tool of Ansoft.

As shown in FIG. 10, the result of return loss characteristic by the simulation is similar to the result of return loss characteristic by the measurement. Also, in both the result of return loss characteristic by the simulation and the result thereof by the measurement, the return losses were less than −20 dB within the frequency range of less than 53 GHz. Therefore, it can be known that the impedance matching is excellent.

As shown in FIG. 10, the resonance occurred at around the frequency 53 GHz of the measured return loss, that is identical to the result obtained from Equation 4. Specifically, leakage of electromagnetic waves did not occur from generation of the resonance. Therefore, according to an aspect of the present invention, an ultra wideband hermetically sealed surface mount for an MMIC may sufficiently provide a function of shielding against electromagnetic waves in order to reduce EMI.

Figure 11:
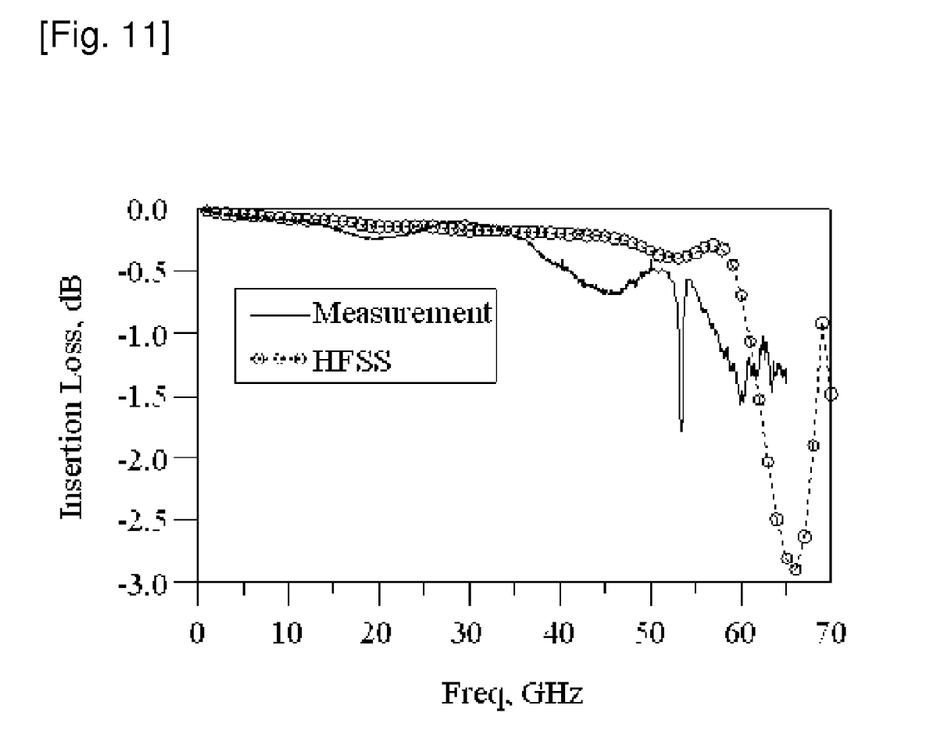
FIG. 11 is a graph illustrating an insertion loss characteristic by a simulation and a measurement with respect to an ultra wideband hermetically sealed mount package for an MMIC according to an exemplary embodiment of the present invention.

FIG. 11 is a graph illustrating an insertion loss characteristic by a simulation and a measurement with respect to an ultra wideband hermetically sealed mount package for an MMIC according to an exemplary embodiment of the present invention.

As shown in FIG. 11, the result of insertion loss characteristic by the simulation is similar to the result of insertion loss characteristic by the measurement. Also, in both the result of insertion loss characteristic by the simulation and the result of insertion loss characteristic by the measurement, the insertion losses were less than 0.6 dB within the frequency range less than 53 GHz. Therefore, the low loss may be achieved.

As described above, an ultra wideband hermetically sealed surface mount package for an MMIC according to the present invention may reduce the discontinuity of vertical transition using a trough line and a slab line in order to obtain less insertion loss and excellent impedance matching. Also, the package may reduce the radiation loss and the crosstalk using SMCPW lines. Also, an ultra wideband hermetically sealed surface mount package for an MMIC according to the present invention may form a cavity for mounting an integrated circuit using a plurality of ground planes and a plurality of ground vias and thereby provide a shielding function from EMI. Also, the package may provide a sealing function of protecting an internal circuit from an external environment using a package cover.

According to the present invention, it is possible to reduce an insertion loss and obtain excellent impedance matching using a trough line and a slab line, and thereby reduce the discontinuity of vertical transition.

Also, according to the present invention, it is possible to reduce a radiation loss and crosstalk using SMCPW lines.

Also, according to the present invention, it is possible to form a cavity for mounting an integrated circuit using a plurality of ground planes and ground vias and thereby shield against EMI.

Also, according to the present invention, it is possible to provide a sealing function using a package cover and thereby protect an internal circuit from an external environment.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. An ultra wideband hermetically sealed surface mount package for a microwave monolithic integrated circuit (MMIC), the package comprising:
   an integrated circuit;
   a package body being mounted with the integrated circuit and comprising a plurality of first dielectrics that is formed in a multilayer, a first line unit that is mounted to a circuit substrate and is electrically connected with an external circuit, a second line unit that is upwardly extended from the first line unit and is electrically connected with the first line unit, a third line unit that is extended to the right angle from the second line unit and is electrically connected with the second line unit, and a bonding unit that electrically connects the third line unit and the mounted integrated circuit; and
   a package cover being formed on the package body to seal the integrated circuit and comprising a plurality of second dielectrics that is formed in a multilayer.

2. The package of claim 1, wherein:
   the first line unit comprises a shielded multilayer coplanar waveguide (SMCPW)1 line that is horizontally formed and is electrically connected with the circuit substrate,
   the second line unit comprises a trough line that is vertically extended from the SMCPW1 line and is electrically connected with the SMCPW1 line, and a slab line that is vertically extended from the trough line and is electrically connected with the trough line, and
   the third line unit comprises an SMCPW2 line that is horizontally extended from the slab line and is electrically connected with the slab line, an SMCPW3 line that is horizontally extended from the SMCPW2 line and is electrically connected with the SMCPW2, and a grounded coplanar waveguide (GCPW)1 line that is horizontally extended from the SMCPW3 line and is electrically connected with the SMCPW3.

3. The package of claim 1, wherein the second line unit comprises a signal via that transfers an electrical signal from the external circuit, a plurality of ground planes, and a plurality of ground vias.

4. The package of claim 1, wherein the circuit substrate comprises a GCPW2 line that is electrically connected with the first line unit.

5. The package of claim 1, wherein an SMCPW1 line of the first line unit, and an SMCPW2 line and an SMCPW3 line of the third line unit are formed in a shielding structure surrounded by a plurality of ground planes and a plurality of ground vias.

6. The package of claim 1, wherein the package body comprises a thermal via that dissipates heat generated from the integrated circuit.

7. The package of claim 1, wherein the bonding unit
electrically connects a GCPW1 line of the third line unit and a radio frequency (RF) pad of the integrated circuit through wire bonding or ribbon bonding, electrically connects a ground plane of the package body and a ground pad of the integrated circuit through wire bonding or ribbon bonding, or
electrically connects an internal direct current (DC) pad of the package body and an internal DC pad of the integrated circuit through wire bonding or ribbon bonding.

* * * * *